United States Patent
Wang et al.

(10) Patent No.: US 12,224,006 B2
(45) Date of Patent: Feb. 11, 2025

(54) HIGH-SPEED AND LARGE-CURRENT ADJUSTABLE PULSE CIRCUIT, OPERATING CIRCUIT AND OPERATING METHOD OF PHASE-CHANGE MEMORY

(71) Applicant: HUAZHONG UNIVERSITY OF SCIENCE AND TECHNOLOGY, Hubei (CN)

(72) Inventors: Xingsheng Wang, Hubei (CN); Yinghao Ma, Hubei (CN); Fan Yang, Hubei (CN); Chengxu Wang, Hubei (CN); Menghua Huang, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 18/031,356

(22) PCT Filed: Jul. 7, 2022

(86) PCT No.: PCT/CN2022/104246
§ 371 (c)(1),
(2) Date: Apr. 12, 2023

(87) PCT Pub. No.: WO2023/236304
PCT Pub. Date: Dec. 14, 2023

(65) Prior Publication Data
US 2024/0371438 A1    Nov. 7, 2024

(30) Foreign Application Priority Data
Jun. 9, 2022    (CN) .......................... 202210650106.0

(51) Int. Cl.
*G11C 11/00* (2006.01)
*G11C 13/00* (2006.01)

(52) U.S. Cl.
CPC ...... *G11C 13/0038* (2013.01); *G11C 13/0004* (2013.01); *G11C 13/0069* (2013.01); *G11C 2013/0078* (2013.01)

(58) Field of Classification Search
CPC ............ G11C 13/0038; G11C 13/0004; G11C 13/0069; G11C 2013/0078
USPC .......................................................... 365/163
See application file for complete search history.

(56) References Cited

U.S. PATENT DOCUMENTS 8,947,924 B2 *  2/2015  Li ..................... G11C 13/0026
                                                365/207
9,042,154 B2 *  5/2015  Guo ..................... G11C 29/028
                                                365/148
(Continued)

FOREIGN PATENT DOCUMENTS

CN        101552603       10/2009
CN        102222891       10/2011
(Continued)

OTHER PUBLICATIONS

"International Search Report (Form PCT/ISA/210) of PCT/CN2022/104246," mailed on Dec. 28, 2022, pp. 1-4.
(Continued)

*Primary Examiner* — Tha-O H Bui
(74) *Attorney, Agent, or Firm* — JCIPRNET

(57) ABSTRACT

A high-speed and large-current adjustable pulse circuit, an operating circuit and an operating method of a phase-change memory are provided. The high-speed and large-current adjustable pulse circuit is provided with a clamping structure, a current mirror structure and a leakage current shut-down structure. The clamping structure including a clamping operational amplifier and a first MOS transistor is configured to generate a reference current. The current mirror structure is configured to generate an output current
(Continued)

proportional to the reference current. The leakage current shutdown structure is configured to turn off the current mirror structure and reduce leakage current when pulse disappear. In this way, a device with an adjustable current and a reduced leakage current is realized.

13 Claims, 7 Drawing Sheets

(56) References Cited

U.S. PATENT DOCUMENTS

| | | | |
|---|---|---|---|
| 9,224,441 B2 * | 12/2015 | Lee | G11C 13/0002 |
| 9,305,611 B2 * | 4/2016 | Chang | H03K 17/687 |
| 2016/0173066 A1 | 6/2016 | Yang et al. | |

FOREIGN PATENT DOCUMENTS

| | | |
|---|---|---|
| CN | 102592671 | 7/2012 |
| CN | 102931974 | 2/2013 |
| CN | 113746454 | 12/2021 |

OTHER PUBLICATIONS

"Written Opinion of the International Searching Authority (Form PCT/ISA/237) of PCT/CN2022/104246," mailed on Dec. 28, 2022, with English translation thereof, pp. 1-6.

Zhou Haibing et al., "A novel design for continuous adjustable pulse current source," Journal of University of Jinan (Science and Technology), vol. 30, Jan. 2016, pp. 7-12.

* cited by examiner

HIGH-SPEED AND LARGE-CURRENT ADJUSTABLE PULSE CIRCUIT, OPERATING CIRCUIT AND OPERATING METHOD OF PHASE-CHANGE MEMORY

CROSS-REFERENCE TO RELATED APPLICATION

This application is a 371 of international application of PCT application serial no. PCT/CN2022/104246, filed on Jul. 7, 2022, which claims the priority benefit of China application no. 202210650106.0, filed on Jun. 9, 2022. The entirety of each of the above-mentioned patent applications is hereby incorporated by reference herein and made a part of this specification.

BACKGROUND

Technical Field

The disclosure belongs to the technical field of semiconductor integrated circuits, and more specifically relates to a high-speed and large-current adjustable pulse circuit, an operating circuit and an operating method of a phase-change memory.

Description of Related Art

Phase-change memory made of phase-change material is a good non-volatile memory device. Phase-change materials generally exist in two states, crystalline and amorphous. The amorphous state exhibits high resistance, and the crystalline state exhibits low resistance. The resistance values of the two states differ by several orders of magnitude. The high and low resistance states may be used to store data "0" and "1" respectively.

The current and voltage applied by the phase-change memory for phase change may vary depending on phase-change material and the structure of the memory cell. Most of the known operating circuits are specialized operating circuits designed for specific phase-change devices. For phase-change memory cells with different material structures, if a unified erasing and writing operation current is adopted, cell operation failure might occur, which will in turn affect the accuracy of information storage. Therefore, it is necessary to design a phase-change memory operating circuit with adjustable current within a certain range.

In addition, since there is also demand for faster operation speed, fast falling edge of the pulse and the small turn-off leakage current facilitate fast annealing of the phase-change memory cell to complete a reset operation. However, the problem of leakage current is serious when the large current and high voltage current pulse are turned off, so it is necessary to design a corresponding current pulse shutdown circuit to solve this problem.

During operation, a high-current pulse (Reset) with a narrow pulse width is applied to the phase-change memory cell in the crystalline state, and the phase-change material is rapidly annealed from the molten state, so the memory cell may be transformed from a crystalline state to an amorphous state. A current pulse (Set) with a smaller amplitude than the Reset pulse but a larger pulse width is applied to the phase-change memory cell in the amorphous state. The phase-change material undergoes slow crystallization, and the memory cell may change from the amorphous state to the crystalline state. During this period, the erasing and writing operation of the phase-change memory is performed relying on the accumulation of heat, so that the phase-change memory unit becomes molten, and then phase change is realized. In particular, the initial stage of the reset process requires the current pulse to reach a high voltage to achieve heat accumulation, and the final stage of the reset process requires a high-speed and short-lived current pulse for rapid annealing. Therefore, the operating circuit of the phase-change memory needs to provide high-voltage, high-speed and large-current pulses. However, existing common CMOS technology normally adopts 3.3V and 1.8V voltages and the like, and higher operating voltages will cause the breakdown of the MOS tube and cause damage to the circuit. Therefore, it is necessary to design a corresponding high-voltage operation scheme to adapt to the high-voltage operation requirements of the phase-change memory.

SUMMARY

To overcome the above defects or make improvement to related art, the disclosure provides a high-speed and large-current adjustable pulse circuit, an operating circuit and an operating method of a phase-change memory, and aims at realizing adjustable current and reducing leakage current.

In order to achieve the above purpose, according to an aspect of the present disclosure, a high-speed and large-current adjustable pulse circuit is provided, which includes a clamping structure, a current mirror structure and a leakage current shutdown structure.

The clamping structure includes a clamping operational amplifier and a first MOS transistor. The non-inverting input terminal of the clamping operational amplifier is configured to connect to a control pulse voltage, an inverting input terminal is grounded through a reference resistor, and the output terminal is connected to a gate of the first MOS transistor. The source terminal of the first MOS transistor is connected with the inverting input terminal of the clamping operational amplifier.

The current mirror structure includes second to fifth MOS transistors. The source terminal of the fourth MOS transistor is connected to the voltage source, the drain terminal thereof is connected to the source terminal of the second MOS transistor, the drain terminal of the second MOS transistor is connected to the drain terminal of the first MOS transistor, the gate of the second MOS transistor is connected to the drain terminal, the gate of the fourth MOS transistor is connected to the drain terminal, the source terminal of the fifth MOS is connected to the voltage source, and the drain terminal thereof is connected to the source terminal of the third MOS transistor. The drain terminal of the third MOS transistor serves as the output terminal of the adjustable pulse circuit, the gate of the second MOS transistor is connected to the gate of the third MOS transistor, and the gate of the fourth MOS transistor is connected to the gate of the fifth MOS transistor.

The leakage current shutdown structure includes a sixth MOS transistor, a seventh MOS transistor and a buffer. The gates of the sixth MOS transistor and the seventh MOS transistor are respectively connected to the control pulse voltage through the buffer, the gate of the fifth MOS transistor is connected to the voltage source through the sixth MOS transistor, the gate of the third MOS transistor is connected to the voltage source through the seventh MOS transistor. The buffer serves to output and turn off the shutdown voltage of the sixth MOS transistor and the seventh MOS transistor when the control pulse occurs, and output and turn on the turn-on voltage of the sixth MOS transistor and the seventh MOS transistor when the control pulse does not occur.

In one of the embodiments, the sixth MOS transistor and the seventh MOS transistor are P-type. When a control pulse occurs, the buffer serves to output a high voltage level to turn off the sixth MOS transistor and the seventh MOS transistor. When a control pulse does not occur, the buffer serves to output a low voltage level to turn on the sixth MOS transistor and the seventh MOS transistor.

In one of the embodiments, the first MOS transistor is N-type, the second to fifth MOS transistors are P-type, the connected control pulse voltage is a positive voltage, and the connected voltage source is a positive voltage VDD. Alternatively, the first MOS transistor is P-type, the second to fifth MOS transistors are N-type, the connected control pulse voltage is a negative voltage, and the connected voltage source is a negative voltage VSS.

In one of the embodiments, in the current mirror structure, the aspect ratio of the fifth MOS transistor is n times the aspect ratio of the fourth MOS transistor, and the aspect ratio of the third MOS transistor is n times the aspect ratio of the second MOS transistor.

In another aspect of the present disclosure, an operating circuit of a phase-change memory is provided, which includes a first current source and a second current source respectively connected to two electrodes of a phase-change memory cell. The first current source and the second current source both adopt the high-speed and large-current adjustable pulse circuit.

In the first current source, the first MOS transistor is N-type, the second to fifth MOS transistors are P-type, the connected control pulse voltage is positive pulse voltage Vpulse1, and the connected voltage source is positive voltage VDD.

In the second current source, the first MOS transistor is P-type, the second to fifth MOS transistors are N-type, the connected control pulse voltage is negative pulse voltage Vpulse2, and the connected voltage source is negative voltage VSS.

In one of the embodiments, VSS=−VDD, the frequency and amplitude of the positive pulse voltage Vpulse1 and the negative pulse voltage Vpulse2 are equal.

In one of the embodiments, the first current source and the second current source are integrated in the same semiconductor substrate, and the first current source adopts a deep N-well process.

In one of the embodiments, when a relatively large current pulse is applied to the phase-change memory cell, the phase-change memory cell changes from a crystalline state to an amorphous state, and when a relatively small current pulse is applied to the phase-change memory cell, the phase-change memory cell changes from an amorphous state to a crystalline state.

According to yet another aspect of the present disclosure, an operating method of a phase-change memory is provided, which includes: connecting the operating circuit of the phase-change memory into the phase-change memory cell; connecting the positive pulse voltage Vpulse1 to the non-inverting input terminal of the clamping operational amplifier in the first current source, and simultaneously connecting the negative pulse voltage Vpulse2 to the non-inverting input terminal of the clamping operational amplifier in the second current source.

In one of the embodiments, the positive pulse voltage and the negative pulse voltage have the same amplitude and the same frequency.

Generally speaking, compared with the related art, the above technical solutions conceived by the present disclosure are able to achieve the following advantageous effects:

First, the high-speed and large-current adjustable pulse circuit designed by this disclosure includes a clamping structure, a current mirror structure and a leakage current shutdown structure. The clamping structure serves to generate a reference current at the drain terminal of the first MOS transistor according to the control pulse voltage. The current mirror structure is able to generate a proportional output current according to the reference current. By adjusting the aspect ratio of the internal MOS transistor, the ratio of the output current to the reference current may be adjusted, so that the output current may be adjusted. The leakage current shutdown structure controls the shutdown of the current mirror structure through the sixth MOS transistor and the seventh MOS transistor. When a control pulse occurs, the sixth and seventh MOS transistors are turned off, and the current mirror structure is not affected and works normally and outputs regulated current; when the control pulse disappears, the sixth and seventh MOS transistors are turned on, the gates of various MOS transistors in the current mirror structure are connected to a voltage source, and various MOS transistors in the current mirror structure is switched on and off through the voltage source. Therefore, the leakage current during disappearance of the pulse is reduced. In this way, the static power loss of the cell may be reduced, and the falling edge of the pulse is accelerated at the same time, which helps to realize the fast operation of the phase-change memory.

Secondly, the operating circuit based on the high-speed and large-current adjustable pulse circuit designed in this disclosure is designed by combining two high-speed and large-current adjustable pulse circuits as the first current source and the second current source respectively to apply regulated current to two electrodes of the phase-change memory cell. In addition to the advantages of adjustable current and small leakage current, by connecting the first current source to the positive pulse voltage and the positive voltage VDD, and connecting the second current source to the negative pulse voltage and the negative voltage VSS, it is possible to combine two parts of the circuits to increase the working voltage range of the pulse current to achieve VSS~VDD. Voltage doubling enables phase-change memory to reach higher voltages at the initial stage of current pulse operation, thus enabling rapid energy accumulation.

DESCRIPTION OF THE EMBODIMENTS

Figure 1:
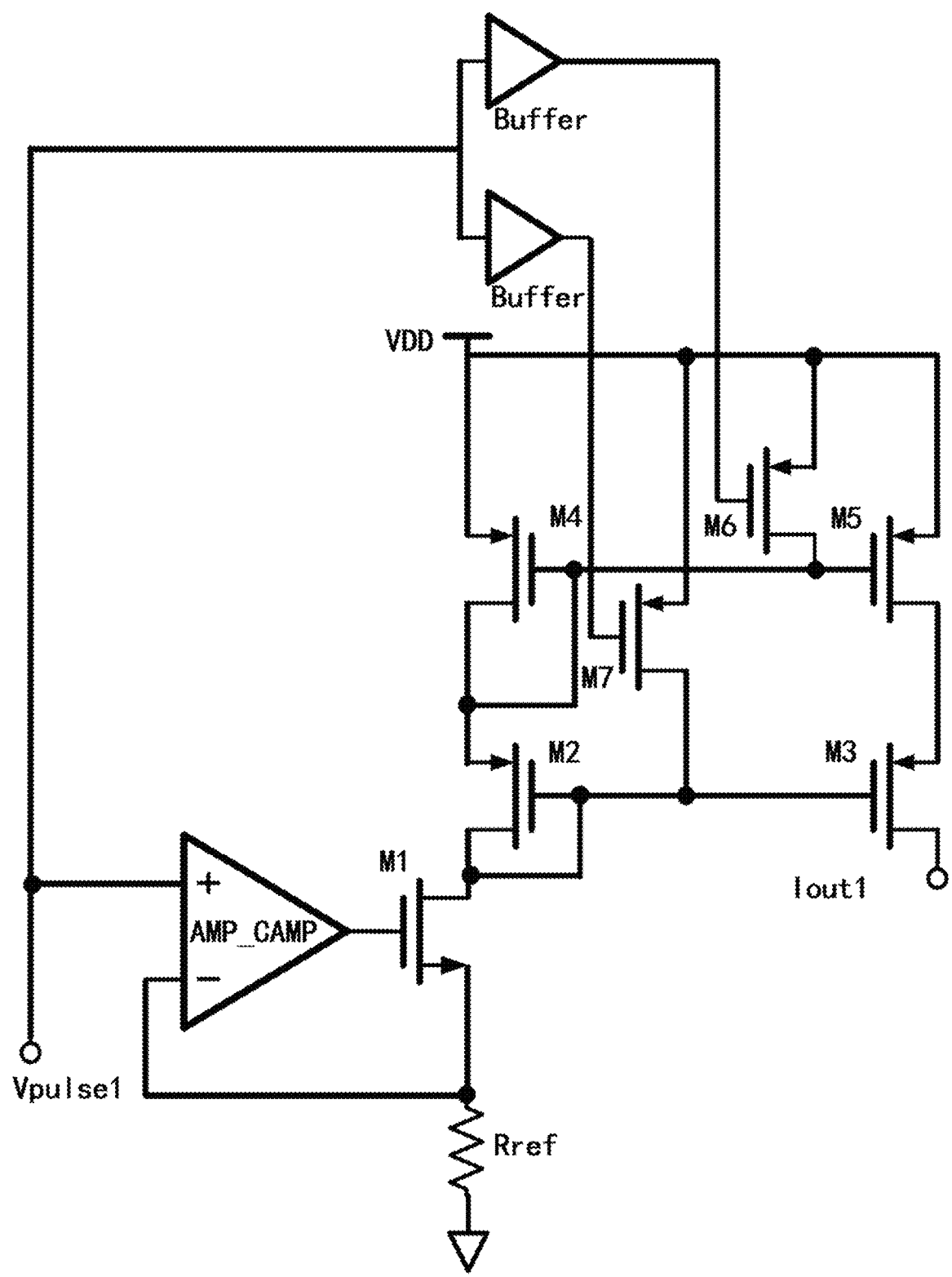
FIG. 1 is a circuit diagram of a high-speed and large-current adjustable pulse circuit in an embodiment.

In order to make the purpose, technical solution and advantages of the present disclosure clearer, the present disclosure will be further described in detail below in conjunction with the accompanying drawings and embodiments. It should be understood that the specific embodiments described here are only used to explain the present disclosure, not to limit the present disclosure. In addition, the technical features involved in the various embodiments of the present disclosure described below can be combined with each other as long as they do not conflict with each other.

The high-speed and large-current adjustable pulse circuit includes a clamping structure, a current mirror structure and a leakage current shutdown structure.

The clamping structure includes a clamping operational amplifier and a first MOS transistor. The non-inverting input terminal of the clamping operational amplifier is configured to connect to a control pulse voltage, an inverting input terminal is grounded through a reference resistor, and the output terminal is connected to a gate of the first MOS transistor. The source terminal of the first MOS transistor is connected with the inverting input terminal of the clamping operational amplifier.

The current mirror structure includes second to fifth MOS transistors. The source terminal of the fourth MOS transistor is connected to the voltage source, the drain terminal thereof is connected to the source terminal of the second MOS transistor, the drain terminal of the second MOS transistor is connected to the drain terminal of the first MOS transistor, the source terminal of the fifth MOS is connected to the voltage source, and the drain terminal thereof is connected to the source terminal of the third MOS transistor. The drain terminal of the third MOS transistor serves as the output terminal of the adjustable pulse circuit, the gate of the second MOS transistor is connected to the gate of the third MOS transistor, and the gate of the fourth MOS transistor is connected to the gate of the fifth MOS transistor. The gate of the second MOS transistor is connected to the drain terminal, and the gate of the fourth MOS transistor is connected to the drain terminal.

The leakage current shutdown structure includes a sixth MOS transistor, a seventh MOS transistor and a buffer. The gates of the sixth MOS transistor and the seventh MOS transistor are respectively connected to the control pulse voltage through the buffer, the gate of the fifth MOS transistor is connected to the voltage source through the sixth MOS transistor, the gate of the third MOS transistor is connected to the voltage source through the seventh MOS transistor. The buffer serves to output and turn off the shutdown voltage of the sixth MOS transistor and the seventh MOS transistor when the control pulse occurs, and output and turn on the turn-on voltage of the sixth MOS transistor and the seventh MOS transistor when the control pulse does not occur.

In the high-speed and large-current adjustable pulse circuit, when the control pulse voltage is applied, the voltage at the inverting input terminal of the operational amplifier is clamped to the same magnitude as the control pulse voltage, and the clamped voltage is applied to the reference resistor Rref to generate a reference current Iref. A current mirror structure is formed by connecting the gate terminals of the second to fifth MOS transistors. By setting the aspect ratio of the MOS transistors inside the current mirror structure, the Iout output from the output terminal of the current mirror structure and the reference current Iref obtained from the input terminal may be in a certain proportion to realize adjustable current.

In the meantime, in the leakage current shutdown structure consisting of the sixth MOS transistor, the seventh MOS transistor and the buffer Buffer, when a control pulse occurs, the output of the Buffer turns off the voltage, and the sixth MOS transistor and the seventh MOS transistor are turned off through the shutdown voltage; the current mirror structure works normally. When the control pulse disappears, the Buffer outputs the turn-on voltage, the sixth MOS transistor and the seventh MOS transistor are turned on through the turn-on voltage, and the gate voltage of the fifth MOS transistor and the third MOS transistor are pulled to the voltage source, which is able to make the third MOS transistor and the fifth MOS transistor to be turned off. In this way, it is possible to significantly reduce the quiescent current at the Iout terminal while accelerating the falling edge of the pulse, thereby facilitating rapid annealing of the phase-change memory cell.

The connected control pulse voltage described above may be a positive pulse voltage Vpulse1 or a negative pulse voltage Vpulse2. When the applied control pulse voltage is the positive pulse voltage Vpulse1 and the connected voltage source is the positive voltage source VDD, the corresponding first MOS transistor is N-type, and the second to fifth MOS transistors are P-type. When the applied control pulse voltage is negative pulse voltage Vpulse2 and the connected voltage source is negative voltage source VSS, the corresponding first MOS transistor is P-type, and the second to fifth MOS transistors are N-type.

As shown in FIG. 1, the applied control pulse voltage is positive pulse voltage Vpulse1, the connected voltage source is positive voltage source VDD, the corresponding first MOS transistor M1 is N-type, and the second to fifth MOS transistors M2~M5 are P type. When the positive pulse voltage Vpulse1 occurs, the drain terminal of the first MOS transistor M1 generates a reference current Iref, the buffer Buffer outputs a shutdown voltage, the sixth MOS transistor M6 and the seventh MOS transistor M7 are turned off, and the current mirror structure works normally. According to the reference current Iref, a proportional output current Iout1 is output from the drain terminal of the third MOS transistor M3. When the positive pulse voltage Vpulse1 disappears, the buffer Buffer outputs a turn-on voltage, the sixth MOS transistor M6 and the seventh MOS transistor M7 are turned on the gates of the third MOS transistor M3 and the fifth MOS transistor M5 are pulled to the voltage source VDD to turn off the MOS transistor. In this way, it is possible to significantly reduce the quiescent current at the Iout terminal while accelerating the falling edge of the pulse, thereby facilitating rapid annealing of the phase-change memory cell.

Similarly, the applied control pulse voltage may be the negative pulse voltage Vpulse2, the connected voltage source is the negative voltage source VSS, the corresponding first MOS transistor is P-type, and the second to fifth MOS transistors are N-type. When the negative pulse voltage Vpulse2 occurs, the drain terminal of the first MOS transistor generates a reference current Iref, the buffer Buffer outputs a shutdown voltage, the sixth MOS transistor and the seventh MOS transistor are turned off, and the current mirror structure works normally. According to the reference current Iref, a proportional output current Iout2 is output from the drain terminal of the third MOS transistor. When the negative pulse voltage Vpulse2 disappears, the buffer Buffer outputs a turn-on voltage, the sixth MOS transistor and the seventh MOS transistor are turned on, and the gates of the third MOS transistor and the fifth MOS transistor are pulled to the voltage source VSS to make the MOS transistor to be turned off. In this way, the quiescent current at the Iout terminal may be considerably reduced, which facilitates rapid annealing of the phase-change memory cell.

In an embodiment, the sixth MOS transistor and the seventh MOS transistor are P-type, under the circumstances, the shutdown voltage output by the buffer Buffer is at high voltage level, and the output turn-on voltage is at low voltage level. When a control pulse occurs, the buffer Buffer outputs a high voltage level, and the sixth MOS transistor and the seventh MOS transistor are turned off. When the control pulse disappears, the buffer Buffer outputs a low voltage level, and the sixth MOS transistor and the seventh MOS transistor are turned on.

In an embodiment, the aspect ratio of the fifth MOS transistor in the current mirror structure is n times the aspect ratio of the fourth MOS transistor, and the aspect ratio of the third MOS transistor is n times the aspect ratio of the second MOS transistor. In this way, the output current may be n times the reference current, and the output current may be adjusted by changing the value of n.

Figure 2:
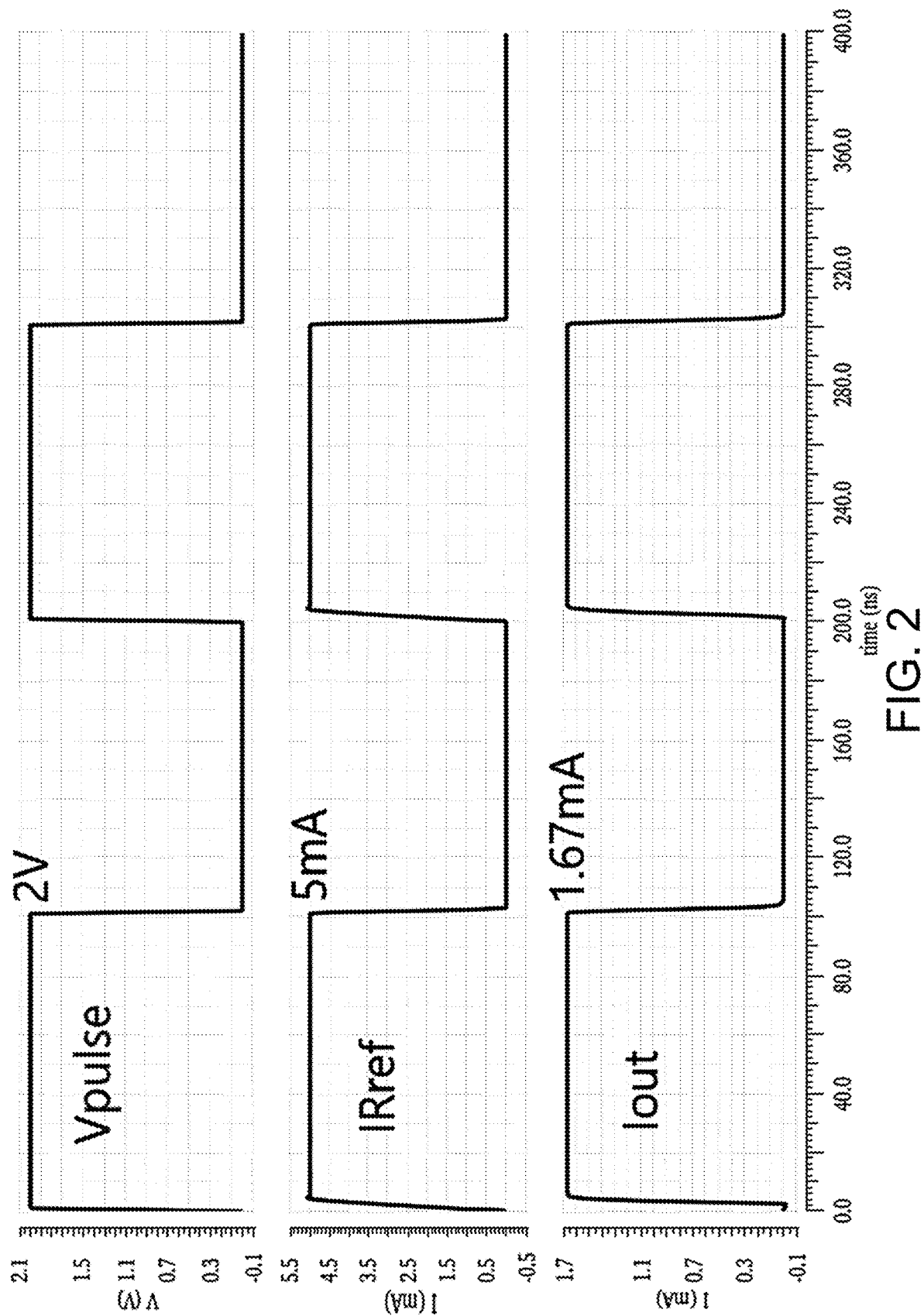
FIG. 2 is a pulse current waveform diagram of a high-speed and large-current adjustable pulse circuit under a specific condition in an embodiment.

FIG. 2 is a pulse current waveform diagram of a high-speed and large-current adjustable pulse circuit in FIG. 1 under a specific condition in the disclosure. The period of the control pulse voltage Vpulse is 200 ns, the amplitude is 2V, the duty cycle is 50%, the reference resistance is set to 200062, the aspect ratio of the second MOS transistor M2 is three times that of the third MOS transistor, and the aspect ratio of the four MOS transistor M4 is three times that of the fifth MOS transistor. The circuit simulation waveform shows that the reference current IRref on the reference resistor is 1 mA, the output current Iout is 0.33 mA, and the rising edge is about 10 ns.

Figure 3:
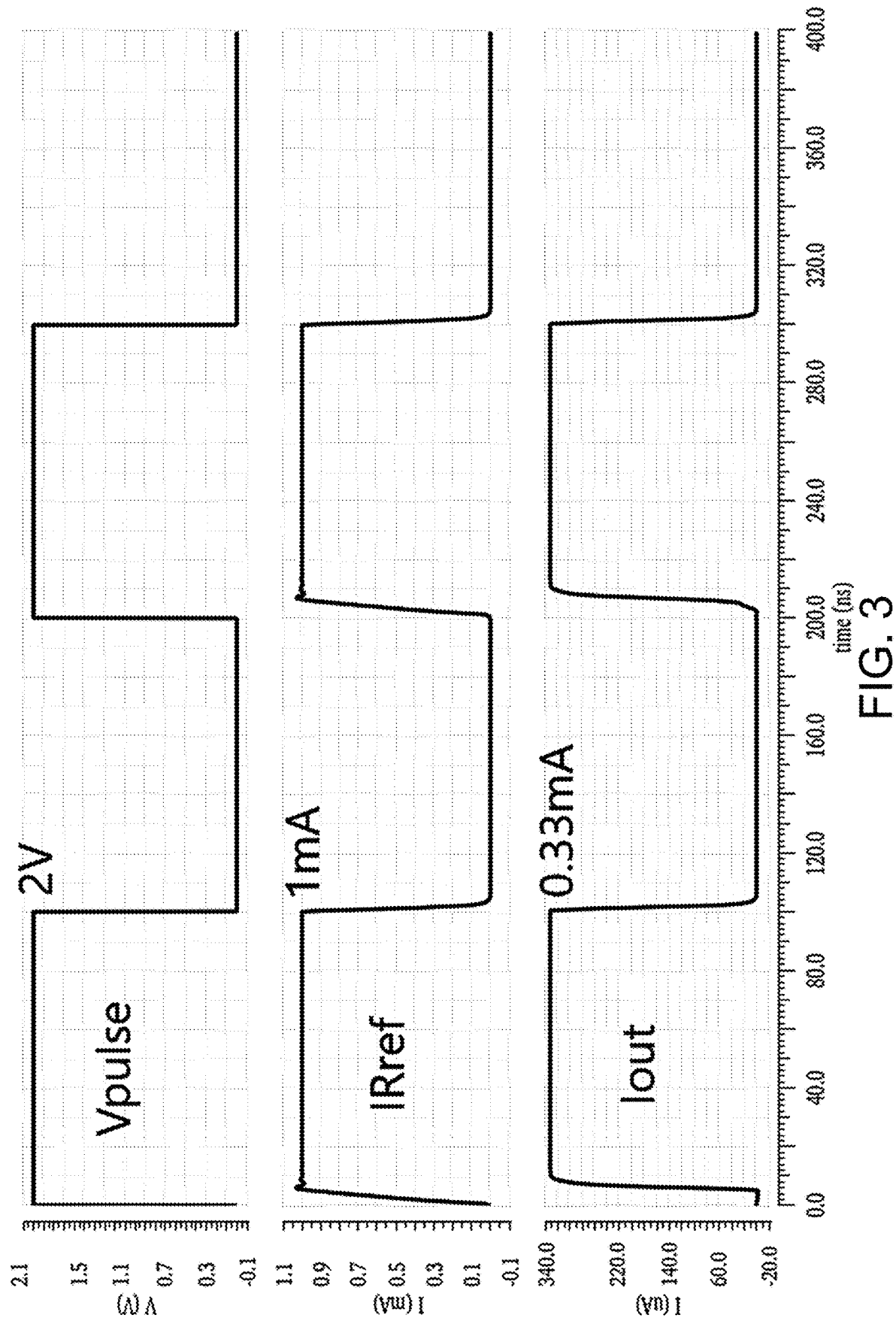
FIG. 3 is a pulse current waveform diagram of a high-speed and large-current adjustable pulse circuit under another specific condition in an embodiment.

FIG. 3 is a pulse current waveform diagram of a high-speed and large-current adjustable pulse circuit in FIG. 1 under another specific condition in the disclosure. The period of the control pulse voltage Vpulse is 200 ns, the amplitude is 2V, the duty cycle is 50%, and the reference resistance is set to 400Ω. The aspect ratio of the second MOS transistor M2 is three times the aspect ratio of the third MOS transistor. The aspect ratio of the fourth MOS transistor M4 is three times that of the fifth MOS transistor. The circuit simulation waveform shows that the reference current IRref on the reference resistor is 5 mA, the output current Iout is 1.67 mA, and the rising edge is about 4 ns. In actual implementation of the disclosure, the reference resistance and the input voltage pulse may be changed according to requirements, so as to realize outputting pulse current with different duty ratios and current amplitudes.

Figure 4:
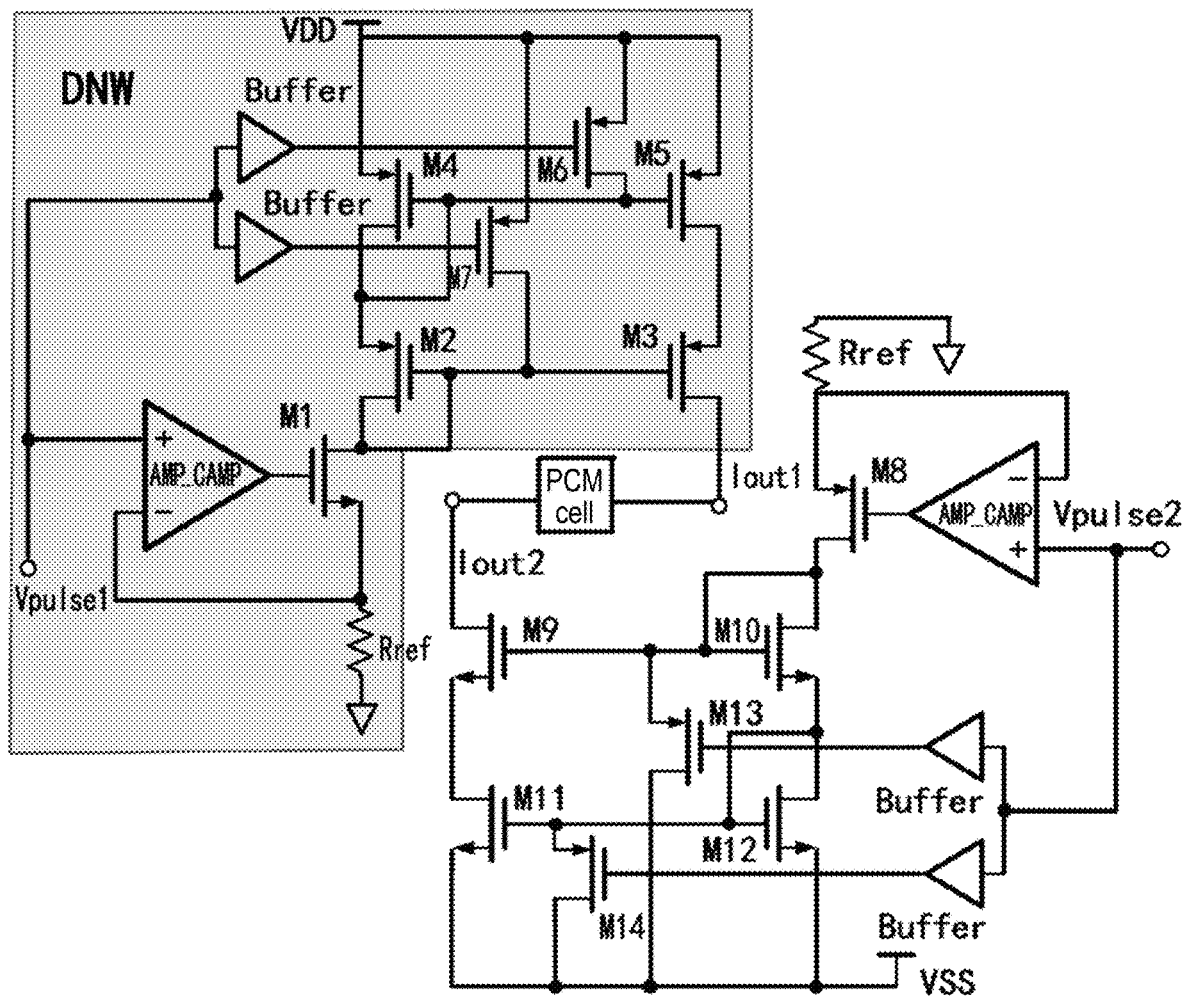
FIG. 4 is a circuit diagram of an operating circuit of a phase-change memory in an embodiment.

Correspondingly, the present disclosure further relates to an operating circuit of a phase-change memory, as shown in FIG. 4. The operating circuit includes the first current source and the second current source respectively connected to the two electrodes of the phase-change memory cell PCM. Both the first current source and the second current source adopt the high-speed and large-current adjustable pulse circuit described above. In the first current source, the first MOS transistor is N-type, the second to fifth MOS transistors are P-type, the connected control pulse voltage is positive pulse voltage Vpulse1, the connected voltage source is positive voltage VDD, and the output current is Iout1; in the second current source, the first MOS transistor is P-type, the second to fifth MOS transistors are N-type, the connected control pulse voltage is negative pulse voltage Vpulse2, the connected voltage source is negative voltage VSS, and the output current is Iout2.

For ease of distinction, the first to seventh MOS transistors in the first current source are sequentially marked as M1 to M7, and the first to seventh MOS transistors in the second current source are sequentially marked as M8 to M14. Among them, M1 is N type, M2~M5 are P type, M8 is P type, and M9~M12 are N type. In an embodiment, M6, M7, M13, and M14 are P-type. In an embodiment, VDD=−VSS, the positive pulse voltage Vpulse1 and the negative pulse voltage Vpulse2 have the same amplitude and the same frequency. In an embodiment, the first current source and the second current source are integrated in the same semiconductor substrate, and the first current source adopts a deep N-well DNW process to realize electrical isolation of the two power sources.

In the operation circuit of the phase-change memory, the power supply voltage of the first current source on the left is VDD to GND, and the power supply voltage of the second current source on the right is GND to VSS. The combination of the two circuits allows the working voltage of the pulse current to reach VSS~VDD. Preferably, the magnitude of the VSS voltage is equal to −VDD in value. In actual practice, the output terminal Iout1 of the first current source and the output terminal Iout2 of the second current source are connected to the phase-change memory cell. By properly selecting the VDD voltage, it may be ensured that all MOS transistors in the circuit structure are in the normal working voltage range. In the meantime, the phase-change memory may also obtain a relatively large operating voltage.

Correspondingly, the present disclosure further relates to an operating method of a phase-change memory, which includes: connecting the operating circuit of the phase-change memory to the phase-change memory cell; connecting the positive pulse voltage Vpulse1 to the non-inverting input terminal of the clamping operational amplifier in the first current source, and simultaneously connecting the negative pulse voltage Vpulse2 to the non-inverting input terminal of the clamping operational amplifier in the second current source.

Figure 5:
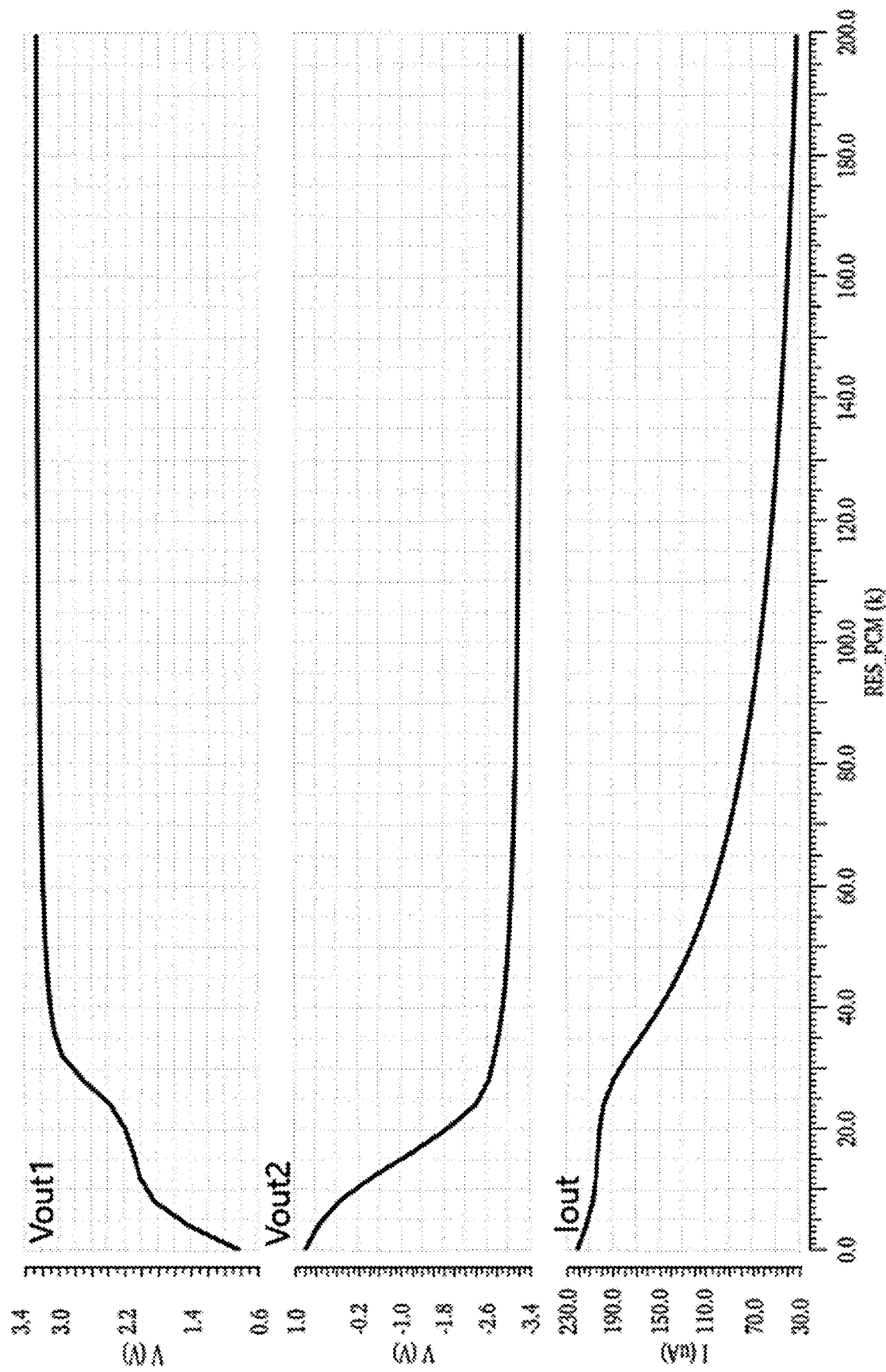
FIG. 5 is a simulation result diagram of a high-voltage circuit in an embodiment.

As shown in FIG. 5. FIG. 5 is the simulation result of a high-voltage circuit in an embodiment of the present disclosure, in which VDD and VSS are set to 3.3V and −3.3V respectively, and the phase-change memory cell is connected between the Iout1 port and the Iout2 port. A pulse voltage of 1V is applied to the Vpulse1 terminal, a pulse voltage of −1V is applied to the Vpulse2 terminal, and the two reference resistors Rref in the circuit are both set to 5KΩ. The resistance value of the phase-change memory serves as a variable for circuit simulation scanning, and thus obtaining the simulation result shown in FIG. 5. Vout1 indicates the output voltage of the Iout1 terminal, and Vout2 indicates the output voltage of the Iout2 terminal. In the initial stage of erasing and writing operations, the phase-change memory has a relatively large resistance. Under the circumstances, a large voltage is applied to the phase-change memory, and the current value is relatively small as this stage is heat accumulation stage. When the phase-change memory cell enters the variable resistance region after heat accumulation, the resistance value of the phase-change memory is about hundreds of Ω. In the simulation results, it may be seen that in this resistance range, the circuit is able to provide a relatively stable current output.

Figure 6:
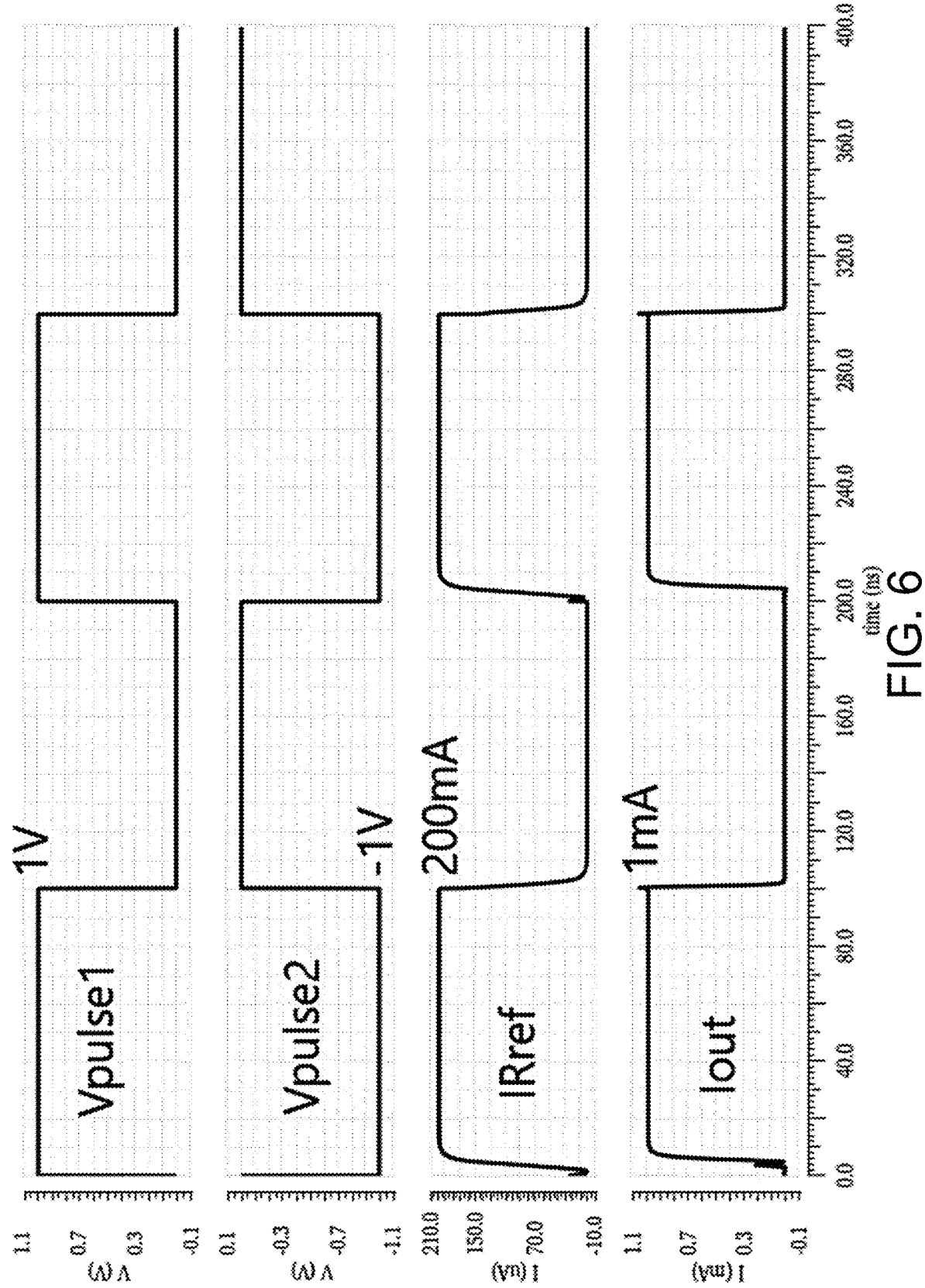
FIG. 6 is a pulse current waveform of an operating circuit of a phase-change memory in an embodiment.

FIG. 6 is a pulse current waveform diagram of an operating circuit in an embodiment of the present disclosure. VDD and VSS are respectively set to 3.3V and −3.3V, and a phase-change memory cell is connected between the Iout1 port and the Iout2 port. A pulse voltage of 1V is applied to the Vpulse1 terminal, a pulse voltage of −1V is applied to the Vpulse2 terminal, and the two reference resistors Rref in the circuit are both set to 5KΩ. The aspect ratio of M3/M2. M5/M4, M9/M10, and M11/M12 is set to five times. The current simulation waveform shows that the reference current IRref on the reference resistor is about 200 uA, and the output current Iout is about 1 mA. The rising edge is about 10 ns, and the falling edge is about 4 ns.

Figure 7:
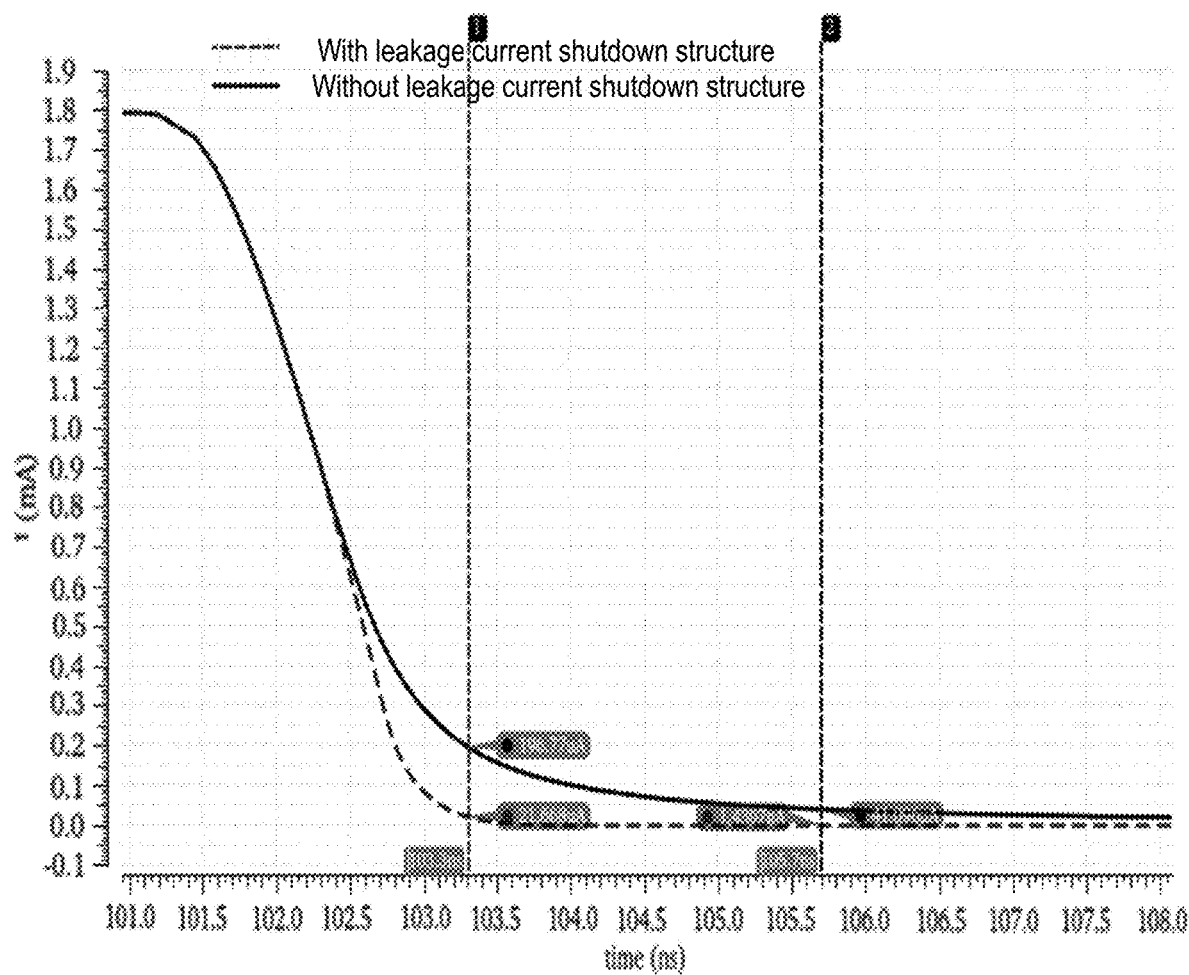
FIG. 7 is a comparison diagram of simulation results of leakage current shutdown modules in an embodiment.

FIG. 7 is a comparison diagram of simulation results of the leakage current shutdown structure in an embodiment of the present disclosure. The solid line in the figure is the simulation result of the non-leakage current shutdown module, and the dashed line is the simulation result of the leakage current shutdown module. The simulation results of the non-leakage current shutdown module show that the pulse falling edge thereof is about 15 ns, and the leakage current is at the uA level. After adding the leakage current shutdown mechanism, the pulse falling edge may be shortened to about 3.5 ns, and the leakage current is at the pA level. Therefore, it can be obtained that this module significantly speeds up the falling edge of the pulse current source and reduces the leakage current by 6 orders of magnitude. Therefore, the problem of serious leakage and long falling edge of the pulse is solved to a great extent. In this way, the problem generated from the high-amplitude narrow pulse requirement on operating circuit design in the Reset operation may be overcome.

It is easy for those skilled in the art to understand that the above descriptions are only preferred embodiments of the present disclosure, and are not intended to limit the present disclosure. Any modifications, equivalent replacements and improvements made within the spirit and principles of the present disclosure should all be included within the scope to be protected by the present disclosure.

What is claimed is:

1. A high-speed and large-current adjustable pulse circuit, comprising a clamping structure, a current mirror structure, and a leakage current shutdown structure, wherein the clamping structure comprises a clamping operational amplifier and a first MOS transistor, a non-inverting input terminal of the clamping operational amplifier is configured to connect to a control pulse voltage, an inverting input terminal of the clamping operational amplifier is grounded through a reference resistor, and an output terminal of the clamping operational amplifier is connected to a gate of the first MOS transistor, a source terminal of the first MOS transistor is connected to the inverting input terminal of the clamping operational amplifier;

the current mirror structure comprises a second MOS transistor, a third MOS transistor, a fourth MOS transistor, and a fifth MOS transistor, wherein a source terminal of the fourth MOS transistor is connected to a voltage source, a drain terminal of the fourth MOS transistor is connected to a source terminal of the second MOS transistor, a drain terminal of the second MOS transistor is connected to a drain terminal of the first MOS transistor, a gate of the second MOS transistor is connected to the drain terminal of the second MOS transistor, a gate of the fourth MOS transistor is connected to the drain terminal of the fourth MOS transistor, a source terminal of the fifth MOS transistor is connected to the voltage source, and a drain terminal of the fifth MOS transistor is connected to a source terminal of the third MOS transistor, a drain terminal of the third MOS transistor serves as an output terminal of the high-speed and large-current adjustable pulse circuit, the gate of the second MOS transistor is connected to a gate of the third MOS transistor, and the gate of the fourth MOS transistor is connected to a gate of the fifth MOS transistor;

the leakage current shutdown structure comprises a sixth MOS transistor, a seventh MOS transistor and a buffer, wherein gates of the sixth MOS transistor and the seventh MOS transistor are respectively connected to the control pulse voltage through the buffer, the gate of the fifth MOS transistor is connected to the voltage source through the sixth MOS transistor, the gate of the third MOS transistor is connected to the voltage source through the seventh MOS transistor, wherein the buffer is configured to output a shutdown voltage for turning off the sixth MOS transistor and the seventh MOS transistor when a control pulse occurs, and the buffer is configured to output a turn-on voltage for turning on the sixth MOS transistor and the seventh MOS transistor when the control pulse does not occur.

2. The high-speed and large-current adjustable pulse circuit according to claim 1, wherein the sixth MOS transistor and the seventh MOS transistor are P-type MOS transistors, wherein when the control pulse occurs, the buffer is configured to output a high voltage level to turn off the sixth MOS transistor and the seventh MOS transistor, wherein when the control pulse does not occur, the buffer is configured to output a low voltage level to turn on the sixth MOS transistor and the seventh MOS transistor.

3. The high-speed and large-current adjustable pulse circuit according to claim 1, wherein the first MOS transistor is a N-type MOS transistor, the second to the fifth MOS transistors are P-type MOS transistors, the control pulse voltage is a positive voltage, and the voltage source is a positive voltage VDD; or the first MOS transistor is a P-type MOS transistor, the second to the fifth MOS transistors are N-type MOS transistors, the control pulse voltage is a negative voltage, and the voltage source is a negative voltage VSS.

4. The high-speed and large-current adjustable pulse circuit according to claim 1, wherein in the current mirror structure, an aspect ratio of the fifth MOS transistor is n times an aspect ratio of the fourth MOS transistor, and an aspect ratio of the third MOS transistor is n times an aspect ratio of the second MOS transistor.

5. An operating circuit of a phase-change memory, comprising a first current source and a second current source respectively connected to two electrodes of a phase-change memory cell, wherein each of the first current source and the second current source includes a high-speed and large-current adjustable pulse circuit, wherein the high-speed and large-current adjustable pulse circuit comprises a clamping structure, a current mirror structure, and a leakage current shutdown structure, wherein the clamping structure comprises a clamping operational amplifier and a first MOS transistor, a non-inverting input terminal of the clamping operational amplifier is configured to connect to a control pulse voltage, an inverting input terminal of the clamping operational amplifier is grounded through a reference resistor, and an output terminal of the clamping operational amplifier is connected to a gate of the first MOS transistor, a source terminal of the first MOS transistor is connected to the inverting input terminal of the clamping operational amplifier;

the current mirror structure comprises a second MOS transistor, a third MOS transistor, a fourth MOS transistor, and a fifth MOS transistor, wherein a source terminal of the fourth MOS transistor is connected to a voltage source, a drain terminal of the fourth MOS transistor is connected to a source terminal of the second MOS transistor, a drain terminal of the second MOS transistor is connected to a drain terminal of the first MOS transistor, a gate of the second MOS transistor is connected to the drain terminal of the second MOS transistor, a gate of the fourth MOS transistor is connected to the drain terminal of the fourth MOS transistor, a source terminal of the fifth MOS transistor is connected to the voltage source, and a drain terminal of the fifth MOS transistor is connected to a source terminal of the third MOS transistor, a drain terminal of the third MOS transistor serves as an output terminal of the high-speed and large-current adjustable pulse circuit, the gate of the second MOS transistor is connected to a gate of the third MOS transistor, and the gate of the fourth MOS transistor is connected to a gate of the fifth MOS transistor;

the leakage current shutdown structure comprises a sixth MOS transistor, a seventh MOS transistor and a buffer, wherein gates of the sixth MOS transistor and the seventh MOS transistor are respectively connected to the control pulse voltage through the buffer, the gate of the fifth MOS transistor is connected to the voltage source through the sixth MOS transistor, the gate of the third MOS transistor is connected to the voltage source through the seventh MOS transistor, wherein the buffer is configured to output a shutdown voltage for turning off the sixth MOS transistor and the seventh MOS transistor when a control pulse occurs, and the buffer is configured to output a turn-on voltage for turning on the sixth MOS transistor and the seventh MOS transistor when the control pulse does not occur, wherein in the first current source, the first MOS transistor is a N-type MOS transistor, the second to the fifth MOS transistors are P-type MOS transistors, the control pulse voltage is a positive pulse voltage Vpulse1, and the voltage source is a positive voltage VDD;

wherein in the second current source, the first MOS transistor is a P-type MOS transistor, the second to the fifth MOS transistors are N-type MOS transistors, the control pulse voltage is a negative pulse voltage Vpulse2, and the voltage source is a negative voltage VSS.

6. The operating circuit of the phase-change memory according to claim 5, wherein VSS=−VDD, and the positive pulse voltage Vpulse1 and the negative pulse voltage Vpulse2 have the same frequencies and the same amplitudes.

7. The operating circuit of the phase-change memory according to claim 5, wherein the first current source and the second current source are integrated in a same semiconductor substrate, and the first current source adopts a deep N-well process.

8. The operating circuit of the phase-change memory according to claim 5, wherein when a relatively large current pulse is applied to the phase-change memory cell, the phase-change memory cell changes from a crystalline state to an amorphous state, and when a relatively small current pulse is applied to the phase-change memory cell, the phase-change memory cell changes from the amorphous state to the crystalline state.

9. An operating method of a phase-change memory, comprising:
connecting an operating circuit of the phase-change memory to a phase-change memory cell, wherein the operating circuit of a phase-change memory comprises a first current source and a second current source respectively connected to two electrodes of a phase-change memory cell, wherein each of the first current source and the second current source includes a high-speed and large-current adjustable pulse circuit;

connecting a positive pulse voltage Vpulse1 to a non-inverting input terminal of a clamping operational amplifier in the first current source, and simultaneously connecting a negative pulse voltage Vpulse2 to a non-inverting input terminal of a clamping operational amplifier in the second current source, wherein the high-speed and large-current adjustable pulse circuit comprises a clamping structure, a current mirror structure, and a leakage current shutdown structure, wherein the clamping structure comprises a clamping operational amplifier and a first MOS transistor, a non-inverting input terminal of the clamping operational amplifier is configured to connect to a control pulse voltage, an inverting input terminal of the clamping operational amplifier is grounded through a reference resistor, and an output terminal of the clamping operational amplifier is connected to a gate of the first MOS transistor, a source terminal of the first MOS transistor is connected to the inverting input terminal of the clamping operational amplifier;

the current mirror structure comprises a second MOS transistor, a third MOS transistor, a fourth MOS transistor, and a fifth MOS transistor, wherein a source terminal of the fourth MOS transistor is connected to a voltage source, a drain terminal of the fourth MOS transistor is connected to a source terminal of the second MOS transistor, a drain terminal of the second MOS transistor is connected to a drain terminal of the first MOS transistor, a gate of the second MOS transistor is connected to the drain terminal of the second MOS transistor, a gate of the fourth MOS transistor is connected to the drain terminal of the fourth MOS transistor, a source terminal of the fifth MOS transistor is connected to the voltage source, and a drain terminal of the fifth MOS transistor is connected to a source terminal of the third MOS transistor, a drain terminal of the third MOS transistor serves as an output terminal of the high-speed and large-current adjustable pulse circuit, the gate of the second MOS transistor is connected to a gate of the third MOS transistor, and the gate of the fourth MOS transistor is connected to a gate of the fifth MOS transistor;

the leakage current shutdown structure comprises a sixth MOS transistor, a seventh MOS transistor and a buffer, wherein gates of the sixth MOS transistor and the seventh MOS transistor are respectively connected to the control pulse voltage through the buffer, the gate of the fifth MOS transistor is connected to the voltage source through the sixth MOS transistor, the gate of the third MOS transistor is connected to the voltage source through the seventh MOS transistor, wherein the buffer is configured to output a shutdown voltage for turning off the sixth MOS transistor and the seventh MOS transistor when a control pulse occurs, and the buffer is configured to output a turn-on voltage for turning on the sixth MOS transistor and the seventh MOS transistor when the control pulse does not occur, wherein in the first current source, the first MOS transistor is a N-type MOS transistor, the second to the fifth MOS transistors are P-type MOS transistors, the control pulse voltage is a positive pulse voltage Vpulse1, and the voltage source is a positive voltage VDD, wherein in the second current source, the first MOS transistor is a P-type MOS transistor, the second to the fifth MOS transistors are N-type MOS transistors, the control pulse voltage is a negative pulse voltage Vpulse2, and the voltage source is a negative voltage VSS.

10. The operating method of the phase-change memory according to claim 9, wherein the positive pulse voltage Vpulse1 and the negative pulse voltage Vpulse2 have the same amplitudes and the same frequencies.

11. The operating method of the phase-change memory according to claim 9, wherein VSS=−VDD, and the positive pulse voltage Vpulse1 and the negative pulse voltage Vpulse2 have the same frequencies and the same amplitudes.

12. The operating method of the phase-change memory according to claim 9, wherein the first current source and the second current source are integrated in a same semiconductor substrate, and the first current source adopts a deep N-well process.

13. The operating method of the phase-change memory according to claim 9, wherein when a relatively large current pulse is applied to the phase-change memory cell, the phase-change memory cell changes from a crystalline state to an amorphous state, and when a relatively small current pulse is applied to the phase-change memory cell, the phase-change memory cell changes from the amorphous state to the crystalline state.

* * * * *